(12) United States Patent
Herchen

(10) Patent No.: US 7,371,022 B2
(45) Date of Patent: May 13, 2008

(54) DEVELOPER ENDPOINT DETECTION IN A TRACK LITHOGRAPHY SYSTEM

(75) Inventor: Harald Herchen, Los Altos, CA (US)

(73) Assignee: Sokudo Co., Ltd. (JP)

( * ) Notice: Subject to any disclaimer, the term of this patent is extended or adjusted under 35 U.S.C. 154(b) by 171 days.

(21) Appl. No.: 11/111,156

(22) Filed: Apr. 20, 2005

(65) Prior Publication Data
US 2006/0132730 A1 Jun. 22, 2006

Related U.S. Application Data

(60) Provisional application No. 60/639,109, filed on Dec. 22, 2004.

(51) Int. Cl.
*G03B 5/00* (2006.01)
*G03C 5/00* (2006.01)

(52) U.S. Cl. ............ 396/611; 396/569; 396/578; 430/30

(58) Field of Classification Search .......... 355/27, 355/53, 67; 356/400; 396/569, 570, 578, 396/611; 430/30, 311
See application file for complete search history.

(56) References Cited

U.S. PATENT DOCUMENTS 5,381,210 A * 1/1995 Hagiwara ............... 355/53
6,458,607 B1 10/2002 Rangarajan et al.
6,579,733 B1 6/2003 Rangarajan et al.
6,758,612 B1 7/2004 Tabery et al.
2002/0071128 A1 * 6/2002 Doan ..................... 356/630
2003/0117606 A1 * 6/2003 Augustyn et al. ........ 355/67
2003/0197848 A1 * 10/2003 Shiraishi .................. 355/67
2004/0043310 A1 * 3/2004 Takeishi et al. .......... 430/22

* cited by examiner

*Primary Examiner*—Alan Mathews
(74) *Attorney, Agent, or Firm*—Townsend and Townsend and Crew LLP

(57) ABSTRACT

A method of detecting developer endpoint. The method includes illuminating a device region of a substrate with a first optical beam prior to initiating a development stage of processing and detecting a baseline optical signal reflected from the device region of the substrate. The method also includes illuminating the device region of the substrate with a second optical beam during a development stage of processing and detecting an endpoint optical signal reflected from the device region of the substrate. The method further includes comparing the baseline optical signal to the endpoint optical signal and determining a developer endpoint based on the comparing step.

10 Claims, 5 Drawing Sheets

DEVELOPER ENDPOINT DETECTION IN A TRACK LITHOGRAPHY SYSTEM

CROSS-REFERENCES TO RELATED APPLICATIONS

This application claims the benefit of U.S. Provisional Application Ser. No. 60/639,109, filed Dec. 22, 2004, entitled "Twin Architecture For Processing A Substrate," which is incorporated herein by reference.

BACKGROUND OF THE INVENTION

The present invention relates generally to the field of semiconductor processing equipment. More particularly, the present invention relates to a method and apparatus for detecting developer endpoint in a semiconductor processing sequence. Merely by way of example, the method and apparatus have been applied to detecting the endpoint during a develop process using reflectometry and scatterometry. But it would be recognized that the invention has a much broader range of applicability.

Semiconductor device geometries have dramatically decreased in size since such devices were first introduced several decades ago. As device geometries have become more dense, reductions in the spacing between device elements has occurred. The minimum linewidths achieved using semiconductor lithography systems, sometimes referred to as a critical dimension (CD) have decreased over time.

Lithography or photolithography generally refers to processes for transferring patterns between a mask layer and a semiconductor substrate. In lithography processes for semiconductor device fabrication, a silicon substrate is uniformly coated with a photosensitive material, referred to as a photoresist, in a cluster tool. A scanner/stepper tool selectively exposes the photoresist to some form of electromagnetic radiation to generate a circuit pattern corresponding to an individual layer of the integrated circuit (IC) device to be formed on the substrate surface. Generally, the photoresist film is selectively exposed using a mask layer that preferentially blocks a portion of the incident radiation. The portions of the photoresist film that are exposed to the incident radiation become more or less soluble depending on the type of photoresist that is utilized. A developing step dissolves the more soluble regions of the photoresist film, producing a patterned photoresist layer corresponding to the mask layer used in the exposure process.

The precision with which the patterns are developed on the semiconductor substrate impacts the CDs present on the substrate, likely impacting device performance. Overdevelopment may result in an increase in linewidths, whereas underdevelopment may result in portions of the photoresist layer not being removed as desired. Various methods have been used to determine the endpoint of the developer process, including visual inspection and trial and error process development. However, the utility of these methods has decreased as device densities have increased.

Therefore, there is a need in the art for improved systems for detecting developer endpoint and improved methods of operating the same.

BRIEF SUMMARY OF THE INVENTION

According to the present invention, techniques related to the field of semiconductor processing equipment are provided. More particularly, the present invention relates to a method and apparatus for detecting developer endpoint in a semiconductor processing sequence. Merely by way of example, the method and apparatus have been applied to detecting the endpoint during a develop process using reflectometry and scatterometry. But it would be recognized that the invention has a much broader range of applicability.

In a specific embodiment of the present invention, a method of detecting developer endpoint is provided. The method includes illuminating a device region of a substrate with a first optical beam prior to initiating a development stage of processing and detecting a baseline optical signal reflected from the device region of the substrate. The method also includes illuminating the device region of the substrate with a second optical beam during a development stage of processing and detecting an endpoint optical signal reflected from the device region of the substrate. The method further includes comparing the baseline optical signal to the endpoint optical signal and determining a developer endpoint based on the comparing step.

In another embodiment of the present invention, a method of detecting developer endpoint is provided. The method includes illuminating a device region of a substrate with a first optical beam inclined at a first angle of incidence and illuminating the device region of the substrate with a second optical beam inclined at substantially normal incidence. The method further includes detecting an optical signal associated with the first optical beam using a first detector, detecting a calibration signal associated with the second optical beam, and adjusting a position of the optical signal at the first detector based on the calibration signal.

In yet another specific embodiment of the present invention, a developer endpoint system is provided. The systems includes a first optical source producing an optical beam propagating along a first optical path inclined at a non-zero angle to and reflecting and diffracting off a device region of a substrate and a first detector coupled to a first reflection path, the first reflection path impinging on the first detector at a first position, the first detector adapted to output a first signal. The systems also includes a second detector coupled to a first diffraction path, the first diffraction path impinging on the second detector at a second position, the second detector adapted to output a second signal and a processor adapted to determine a baseline signal computed from the first signal and the second signal and determine an endpoint signal computed from the first signal and the second signal. In an alternative embodiment, the system further includes a second optical source producing an optical beam propagating along a second optical path substantially normal to and reflecting off the device region of the substrate, a beamsplitter and a first detector coupled to the second optical path, the second optical beam impinging on the second detector at a second position, a first active mirror positioned in the first reflection path, the first active mirror adapted to deflect the optical beam present in the first reflection path in response to variations in a surface morphology of the developer layer, and a second active mirror positioned in the first diffraction path, the second active mirror adapted to deflect the optical beam present in the first diffraction path in response to variations in a surface morphology of the developer layer.

Many benefits are achieved by way of the present invention over conventional techniques. For example, more uniform critical dimensions are achieved across the substrate dimensions by utilizing the methods and apparatus provided by embodiments of the present invention. Additionally, control of the develop process provides for reductions in line edge roughness and develop times. Moreover, reductions in develop defects, for example, T-topping, footing, and the like are provided by embodiments of the present invention. These and other benefits will be described in more detail throughout the present specification and more particularly below.

These and other embodiments of the invention along with many of its advantages and features are described in more detail in conjunction with the text below and attached figures.

DETAILED DESCRIPTION OF THE INVENTION

According to the present invention, techniques related to the field of semiconductor processing equipment are provided. More particularly, the present invention relates to a method and apparatus for detecting developer endpoint in a semiconductor processing sequence. Merely by way of example, the method and apparatus have been applied to detecting the endpoint during a develop process using reflectometry and scatterometry. But it would be recognized that the invention has a much broader range of applicability.

Figure 1:
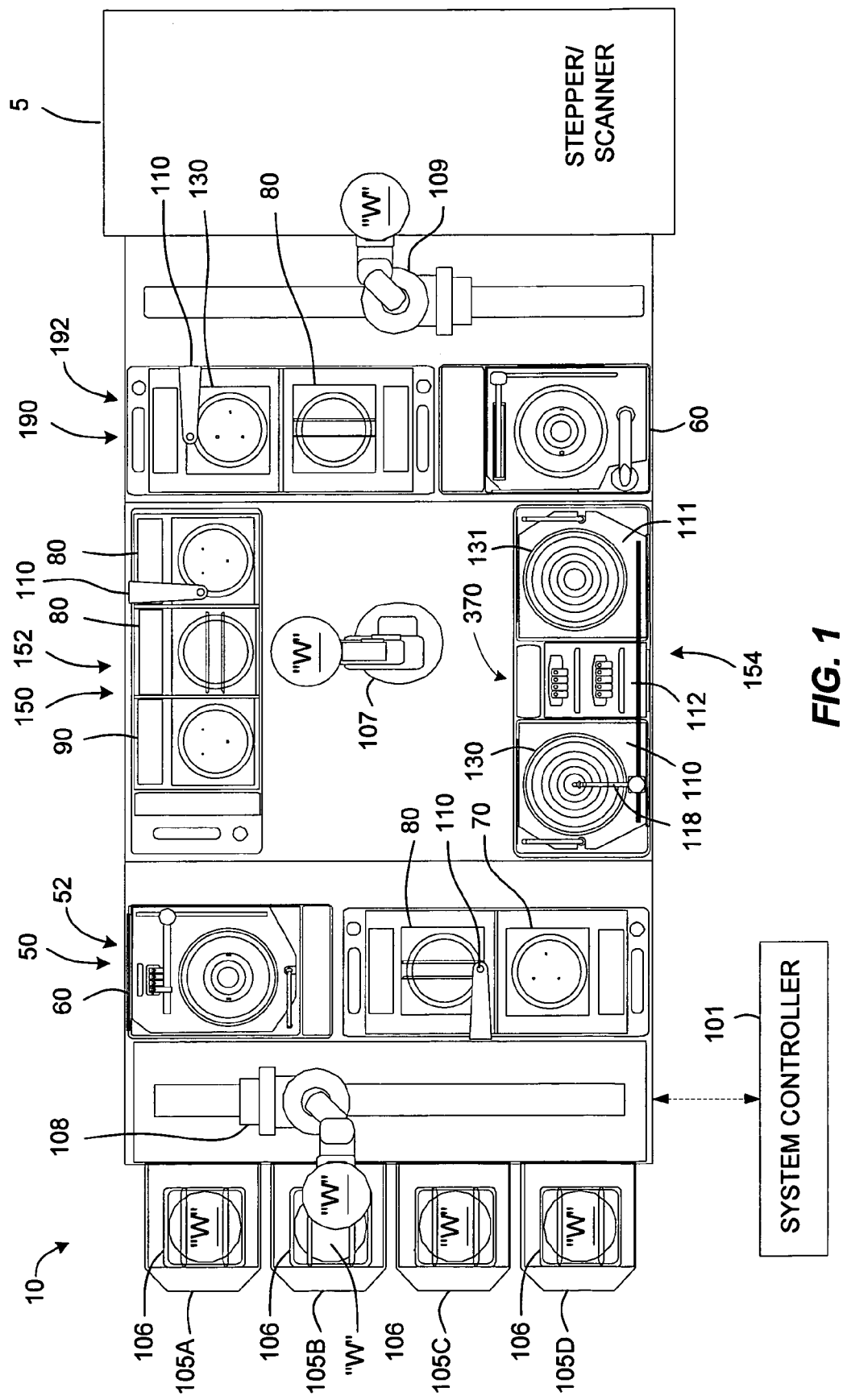
FIG. 1 is a plan view of one embodiment of a track lithography tool according to one embodiment of the present invention.

FIG. 1 is a plan view of one embodiment of a track lithography tool 10 in which the developer endpoint detection system of the present invention may be used. One embodiment of the track lithography 10, as illustrated in FIG. 1, contains a front end module (sometimes referred to as a factory interface) 50, a central module 150, and a rear module (sometimes referred to as a scanner interface) 190. The front end module 50 generally contains one or more pod assemblies or FOUPS 105 (e.g., items 105A-D), a front end robot 108, and a front end processing rack 52. The central module 150 will generally contain a first central processing rack 152, a second central processing rack 154, and a central robot 107. The rear module 190 will generally contain a rear processing rack 192 and a back end robot 109. In one embodiment, the track lithography tool 10 contains: a front end robot 108 adapted to access processing modules in the front end processing rack 52; a central robot 107 that is adapted to access processing modules in the front end processing rack 52, the first central 10 processing rack 152, the second central processing rack 154 and/or the rear processing rack 192; and a back end robot 109 that is adapted to access processing modules in the rear processing rack 192 and in some cases exchange substrates with a stepper/scanner 5. In one embodiment, a shuttle robot 110 is adapted to transfer substrates between two or more adjacent processing modules retained in one or more processing racks (e.g., front end processing rack 52, first central processing rack 152, etc.). In one embodiment, a front end enclosure 104 is used to control the environment around the front end robot 108 and between the pods assemblies 105 and front end processing rack 52.

FIG. 1 also contains more detail of possible process chamber configurations found in aspects of the invention. For example, the front end module 50 generally contains one or more pod assemblies or FOUPs 105, a front end robot 108 and a front end processing rack 52. The one or more pod assemblies 105, are generally adapted to accept one or more cassettes 106 that may contain one or more substrates "W", or wafers, that are to be processed in the track lithography tool 10. The front end processing rack 52 contains multiple processing modules (e.g., bake plate 90, chill plate 80, etc.) that are adapted to perform the various processing steps found in the substrate processing sequence. In one embodiment, the front end robot 108 is adapted to transfer substrates between a cassette mounted in a pod assembly 105 and between the one or more processing modules retained in the front end processing rack 52.

The central module 150 generally contains a central robot 107, a first central processing rack 152 and a second central processing rack 154. The first central processing rack 152 and a second central processing rack 154 contain various processing modules (e.g., coater/developer module with shared dispense 370, bake module 90, chill plate 80, etc.) that are adapted to perform the various processing steps found in the substrate processing sequence. In one embodiment, the central robot 107 is adapted to transfer substrates between the front end processing rack 52, the first central processing rack 152, the second central processing rack 154 and/or the rear processing rack 192. In one aspect, the central robot 107 is positioned in a central location between the first central processing rack 152 and a second central processing rack 154 of the central module 150.

The rear module 190 generally contains a rear robot 109 and a rear processing rack 192. The rear processing rack 192 generally contains processing modules (e.g., coater/developer module 60, bake module 90, chill plate 80, etc.) that are adapted to perform the various processing steps found in the substrate processing sequence. In one embodiment, the rear robot 109 is adapted to transfer substrates between the rear processing rack 190 and a stepper/scanner 5. The stepper/scanner 5, which may be purchased from Canon USA, Inc. of San Jose, Calif., Nikon Precision Inc. of Belmont, Calif., or ASML US, Inc. of Tempe Arizona, is a lithographic projection apparatus used, for example, in the manufacture of integrated circuits (ICs). The scanner/stepper tool 5 exposes a photosensitive material (resist), deposited on the substrate in the cluster tool, to some form of electromagnetic radiation to generate a circuit pattern corresponding to an individual layer of the integrated circuit (IC) device to be formed on the substrate surface.

In one embodiment, a system controller 101 is used to control all of the components and processes performed in the cluster tool 10. The controller 101, is generally adapted to communicate with the stepper/scanner 5, monitor and control aspects of the processes performed in the cluster tool 110, and is adapted to control all aspects of the complete substrate processing sequence. The controller 101, which is typically a microprocessor-based controller, is configured to receive inputs from a user and/or various sensors in one of the processing chambers and appropriately control the processing chamber components in accordance with the various inputs and software instructions retained in the controller's memory. The controller 101 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 101 determines which tasks are performable in the processing chamber(s). Preferably, the program is software readable by the controller 101 and includes instructions to monitor and control the process based on defined rules and input data.

FIG. 1 further illustrates a coater/developer module with a shared dispense 370 mounted in the second central processing rack 154, that may adapted to perform a photoresist coat step or a develop step in both of the process chambers 110 and 111. This configuration is advantageous since it allows some of the common components found in the two process chambers 110 and 111 to be shared thus reducing the system cost, complexity and footprint of the tool. As illustrated in FIG. 1 and described in more detail below, two spin chucks 130 and 131 are provided in processing chambers 110 and 111, respectively. A shared central fluid dispense bank 112 is positioned between the two processing chambers and dispense arm assembly 118 is able to select nozzles from the central fluid dispense bank and serve both spin chucks. Central robot 107 as illustrated in FIG. 1 is able to access both processing chambers 110 and 111 independently.

Figure 2:
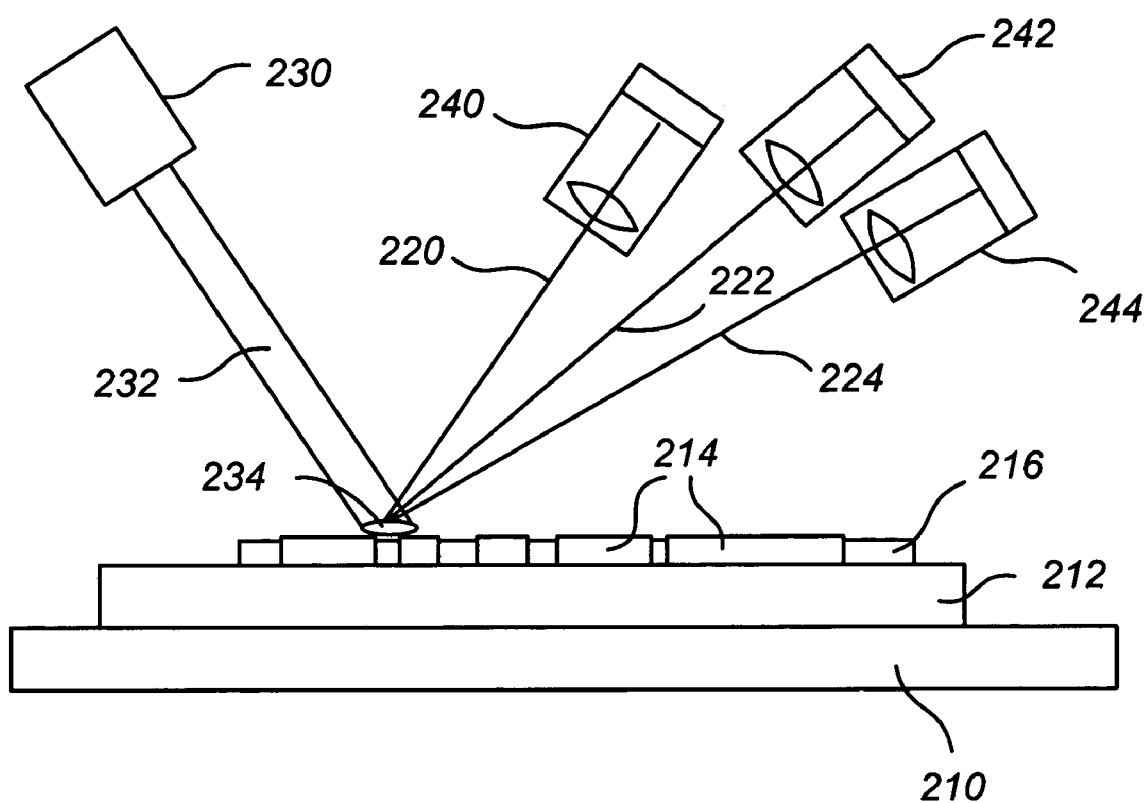
FIG. 2 is a simplified schematic diagram of a developer endpoint detection system according to a specific embodiment of the present invention.

FIG. 2 is a simplified schematic diagram of a developer endpoint detection system according to a specific embodiment of the present invention. The developer endpoint detection systems provided by embodiments of the present invention are generally provided inside coater/developer modules 60 or inside the coater/developer module with a shared dispense 370. As described below, elements of developer endpoint detection systems according to the present invention are positioned inside the developer modules in locations above the plane of the substrate. Merely by way of example, in a specific embodiment, the optical elements are mounted in opposing upper corners of the process module or chamber. Of course, one of ordinary skill in the art would recognize many variations, modifications, and alternatives.

As will be evident to one of skill in the art, it is not necessary that every element of systems according to the present invention be located inside the developer module or chamber, as, for example, optical radiation produced by an external source may be communicated to the developer module, or other chamber in which the endpoint detection measurements are made, through fiber optic cables. Additionally, as discussed more fully below in relation to baseline measurements, developer endpoint detection systems provided by embodiments of the present invention may be contained in process chambers other than the coat/develop modules. Moreover, although in a particular embodiment, the methods and systems of the present invention are applied in the context of a lithographic development process, the present invention is not limited to this application. In alternative embodiments, other develop processes are included in the scope of the present invention.

As illustrated in FIG. 2, which provides a side view of one embodiment of the present invention, a support surface 210 is provided and a substrate 212 is mounted on the support surface. Although FIG. 1 does not illustrate substrates "W" as mounted in modules 60 or 370, one of skill in the art will appreciate that substrates are positioned in the coat/develop modules during various stages of processing. Typically, the substrate is a semiconductor wafer at one stage of processing. In some embodiments, the support surface is an electrostatic chuck coupled to a drive mechanism (not shown) that is adapted to translate the substrate 212 vertically and rotate the substrate as well. In alternative embodiments, the support surface 210 is a vacuum chuck. One of ordinary skill in the art would recognize many variations, modifications, and alternatives.

As illustrated in FIG. 2, substrate 212 is patterned to form a number of device features 214 distributed on a surface of the substrate. Generally the device features are associated with ICs fabricated on the substrate. As is well known to one of skill in the art, the process of manufacturing ICs may include more than 100 steps, with many of the steps being photolithography processes. Accordingly, although FIG. 2 simply illustrates a single group of device features 214 on the surface of the substrate, it is understood that the figure illustrates a stage of processing in which a number of layers may have already been patterned on the substrate. In addition, many additional layers may yet be patterned on the substrate surface. FIG. 2 is not drawn to scale, as generally, device features associated with ICs fabricated on the substrate are of micron and sub-micron dimensions and not clearly resolved without microscopic techniques.

Optical source 230 produces beam 232, which is directed toward the surface of the substrate 212. The beam is illustrated as collimated in FIG. 2 and an optical system (not shown) is used in some embodiments to provide a beam of the desired dimensions at the surface of the substrate. In one embodiment, the area on the surface of the substrate, on which the beam emitted from the laser 230 is projected, is defined as the detection area 234. In one embodiment, the size of the detection area is varied or controlled so that the amount of noise contained in the detected signal is minimized. Noise in the detected signal can be generated due to the variation in the pattern topology seen by the detection area during processing. Accordingly, in one embodiment, the beam is expanded and collimated to expose a number of different device features. In other embodiments, the beam is focused to a reduced diameter and then collimated to expose a fewer number of device features using the beam 232. Of course, the particular beam dimensions selected will depend on the various applications.

Generally, the optical source 230 is a tunable, single-wavelength laser, but this is not required by the present invention. In alternative embodiments, the optical source is a discharge lamp or other narrow band optical source selected for the output wavelength and spectral bandwidth. In alternative embodiments, the optical source 230 is a group of single frequency laser sources optically combined to produce a single, multi-spectral beam. One of ordinary skill in the art would recognize many variations, modifications, and alternatives. As described more fully below, a multi-spectral beam, either generated sequentially using a tunable source or simultaneously using one or more lasers, for example, enables enhanced system performance.

As illustrated in FIG. 2, a developer puddle 216 is illustrated on the surface of the substrate and intermingled with the device features 214. Although the developer puddle 216 illustrated in FIG. 2 is at a level below the upper surfaces of the device features, this is not required by the present invention. As will be evident to one of skill in the art, embodiments of the present invention may be used with developer puddles thicker than the device features being developed. Optical beam 232 impinges on the surface of the device features and the developer puddle and is reflected off the interfaces defining the boundaries of the device features and the developer puddle.

Additionally, the beam is refracted as it enters the developer puddle, subsequently reflecting off device features submerged under the developer puddle and refracting at the developer puddle/air interface. Moreover, the beam is diffracted by features on the order of the wavelength of the optical beam. For many sub-micron device features, significant diffraction of the beam results. In FIG. 2, these complex optical processes are represented by beams 220, 222, and 224. One of ordinary skill in the art would recognize that scattering of the beam as a result of diffuse reflection off the surface will generally result in a cone of scattered radiation, depending on the proportions of specular and diffuse reflection. Additionally, multiple reflections off layers and interfaces will generate interference patterns and other optical phenomena. For purposes of clarity in the illustration, these effects are incorporated into the simple beam 220, although it is appreciated that an optical system (not shown) is generally utilized to collect, collimate, and/or image the radiation reflected from the substrate surface onto the detectors 240, 242, and 244.

In one embodiment, the detector 240 is oriented to receive a primary reflection from the surface and thus is aligned with the incident beam (e.g., the same absolute value for the angle of incidence relative to the surface as the beam 232). Due to the interference between the impinging beam and the pattern formed in the resist during the exposure and develop processes, the intensity of the detected radiation at detector 240 will vary as the development step progresses. In one embodiment, the variation in the intensity of the reflected radiation detected by detector 240 is created when the developer dissolves the soluble portions of the photoresist during the development process, thus causing a pattern to emerge as from a "grating" type feature, thereby generating interference with the impinging beam. Therefore, the interference with the photoresist pattern causes scattering of the impinging beam, which causes a reduction in the main reflection that is detected at detector 240. In one embodiment, the developer endpoint is detected when the change in the reflected intensity measured by the detector 240 asymptotically approaches zero.

Although in some embodiments, the device features form a "grating" type diffraction pattern as a result of beam 232 striking the substrate surface, this is not to say a "diffraction grating," defined as a repetitive array of diffracting elements, either apertures or obstacles, that has the effect of producing periodic alterations in the phase, amplitude, or both of an emergent wave, is required by embodiments of the present invention. In some embodiments, a photolithographically defined diffraction grating feature may be provided on the surface of the substrate, in a more general sense, the actual structure of the various device features (e.g., submicron features) produces diffraction of light. Therefore, embodiments of the present invention include both traditional diffraction gratings as well as diffraction effects resulting from actual device features.

In one embodiment, a tunable laser is used in place of a single wavelength laser to more easily detect the change in the sharpness of the resist pattern as the develop process progresses. The amount of interference will depend on the size of the formed "grating" and the wavelength of the incident radiation. In another embodiment, a number of detectors (e.g., 240, 242, and 244) are utilized that detect the zero-order reflection as well as higher diffracted orders. As illustrated in FIG. 2, detector 242 detects the first-order diffracted beam at wavelength $\lambda_1$ and detector 244 detects the first-order diffracted beam at wavelength $\lambda_2$. Although two detectors 242 and 244 are illustrated for detecting the first-order diffracted beam, in alternative embodiments, a one or two-dimensional detector array, for example, a two-dimensional charge coupled device (CCD) array, is utilized to detect the first-order beam. The endpoint detection process includes monitoring the scattering/diffraction and shift in intensity of the reflected radiation for the various diffracted orders. One of ordinary skill in the art would recognize many variations, modifications, and alternatives. To prevent noise generated from the reflection of emitted radiation from the developer puddle present on the substrate surface during the development process, a slit may be used to prevent the specular reflection from this layer from reaching the detectors.

In the above discussion, a primary diffracted order associated with multiple wavelengths was detected using multiple detectors. As one of skill in the art will appreciate from examination of the grating equation, a pattern with multiple periodicities will produce diffracted beams oriented at multiple angles even for a monochromatic source. Therefore, in some embodiments of the present invention, detectors 242 and 244 are used to detect beams diffracted at two angles from the surface of the substrate. Of course two-dimensional CCD arrays may also be utilized. One of skill in the art will understand that in general, the diffraction pattern produced in the plane of the detectors will be a function of the incident radiation spectral content, as well as the periodicities present in the patterned surface. Thus, in some embodiments, analysis functions incorporating these complexities will be provided.

In some embodiments, the substrate is spinning during the development process. Thus, in a specific embodiment of the present invention, light reflected and diffracted from the detection area is time averaged as the substrate rotates with respect to the optical beam. In this specific embodiment, a "bulk" or average measurement is made that corresponds to the portions of the substrate and device features sweeping past the optical beam as a function of time.

Figure 3A:
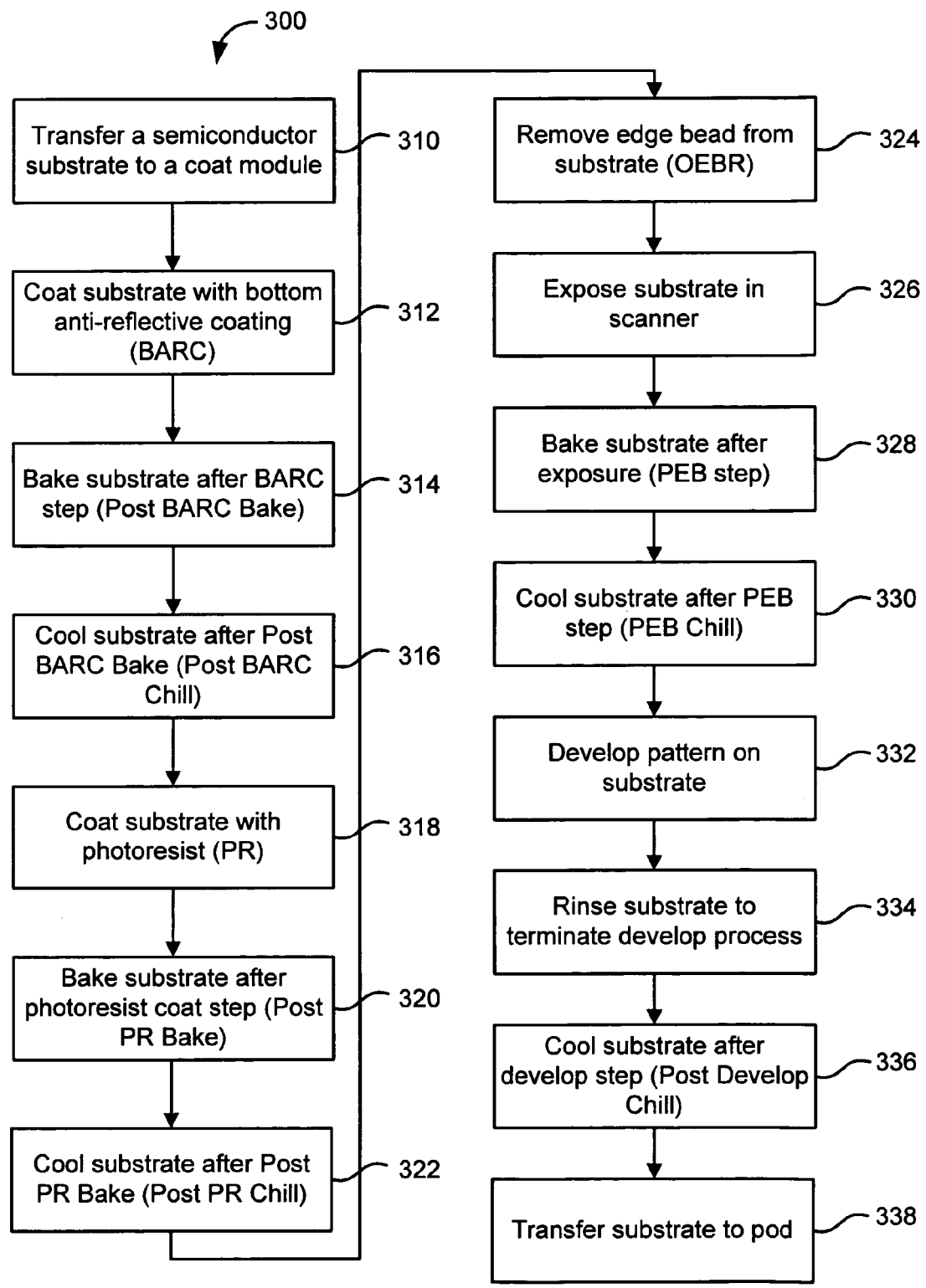
FIG. 3A is a flowchart illustrating a processing sequence for a semiconductor substrate according to one embodiment of the present invention.

FIG. 3A is a flowchart illustrating a processing sequence for a semiconductor substrate according to one embodiment of the present invention. FIG. 3A illustrates one embodiment of a series of method steps 300 that may be used to deposit, expose and develop a photoresist material layer formed on a substrate surface. The lithographic process may generally contain the following: a transfer substrate to coat module step 310, a bottom anti-reflective coating (BARC) coat step 312, a post BARC bake step 314, a post BARC chill step 316, a photoresist coat step 318, a post photoresist bake step 320, a post photoresist chill step 322, an optical edge bead removal (OEBR) step 324, an exposure step 326, a post exposure bake (PEB) step 328, a post exposure bake chill step 330, a develop step 332, a post develop chill step 334 and a transfer substrate to pod step 336. In other embodiments, the sequence of the method steps 300 may be rearranged, altered, one or more steps may be removed, or two or more steps may be combined into a single step without varying from the basic scope of the invention.

In step 310, a semiconductor substrate is transferred to a coat module. Referring to FIG. 1, the step of transferring the substrate to the coat module 310 is generally defined as the process of having the front end robot 108 remove a substrate from a cassette 106 resting in one of the pod assemblies 105. A cassette 106, containing one or more substrates "W", is placed on the pod assembly 105 by the user or some external device (not shown) so that the substrates can be processed in the cluster tool 10 by a user-defined substrate processing sequence controlled by software retained in the system controller 101.

The BARC coat step 310 is a step used to deposit an organic material over a surface of the substrate. The BARC layer is typically an organic coating that is applied onto the substrate prior to the photoresist layer to absorb light that otherwise would be reflected from the surface of the substrate back into the resist during the exposure step 326 performed in the stepper/scanner 5. If these reflections are not prevented, standing waves will be established in the resist layer, which cause feature size to vary from one location to another depending on the local thickness of the resist layer. The BARC layer may also be used to level (or planarize) the substrate surface topography, which is generally present after completing multiple electronic device fabrication steps. The BARC material fills around and over the features to create a flatter surface for photoresist application and reduces local variations in resist thickness. The BARC coat step 310 is typically performed using a conventional spin-on resist dispense process in which an amount of the BARC material is deposited on the surface of the substrate while the substrate is being rotated which causes a solvent in the BARC material to evaporate and thus causes the material properties of the deposited BARC material to change. The air flow and exhaust flow rate in the BARC processing chamber is often controlled to control the solvent vaporization process and the properties of the layer formed on the substrate surface.

The post BARC bake step 314, is a step used to assure that all of the solvent is removed from the deposited BARC layer in the BARC coat step 312, and in some cases to promote adhesion of the BARC layer to the surface of the substrate. The temperature of the post BARC bake step 314 is dependent on the type of BARC material deposited on the surface of the substrate, but will generally be less than about 250° C. The time required to complete the post BARC bake step 314 will depend on the temperature of the substrate during the post BARC bake step, but will generally be less than about 60 seconds.

The post BARC chill step 316, is a step used to control and assure that the time the substrate is above ambient temperature is consistent so that every substrate sees the same time-temperature profile and thus process variability is minimized. Variations in the BARC process time-temperature profile, which is a component of a substrates wafer history, can have an effect on the properties of the deposited film layer and thus is often controlled to minimize process variability. The post BARC chill step 316, is typically used to cool the substrate after the post BARC bake step 314 to a temperature at or near ambient temperature. The time required to complete the post BARC chill step 316 will depend on the temperature of the substrate exiting the post BARC bake step, but will generally be less than about 30 seconds.

The photoresist coat step 318, is a step used to deposit a photoresist layer over a surface of the substrate. The photoresist layer deposited during the photoresist coat step 318 is typically a light sensitive organic coating that are applied onto the substrate and is later exposed in the stepper/scanner 5 to form the patterned features on the surface of the substrate. The photoresist coat step 318 is a typically performed using conventional spin-on resist dispense process in which an amount of the photoresist material is deposited on the surface of the substrate while the substrate is being rotated which causes a solvent in the photoresist material to evaporate and thus causes the material properties of the deposited photoresist layer to change. The air flow and exhaust flow rate in the photoresist processing chamber is controlled to control the solvent vaporization process and the properties of the layer formed on the substrate surface. In some cases it may be necessary to control the partial pressure of the solvent over the substrate surface to control the vaporization of the solvent from the resist during the photoresist coat step by controlling the exhaust flow rate and/or by injecting a solvent near the substrate surface. Referring to FIG. 1, in an exemplary photoresist coating process, the substrate is first positioned on wafer chuck 131 in coater/developer module 370. A motor rotates the wafer chuck 131 and substrate while the photoresist is dispensed onto the center of the substrate. The rotation imparts an angular torque onto the photoresist, which forces the photoresist out in a radial direction, to ultimately covering the substrate.

The post photoresist bake step 320, is a step used to assure that all of the solvent is removed from the deposited photoresist layer in the photoresist coat step 318, and in some cases to promote adhesion of the photoresist layer to the BARC layer. The temperature of the post photoresist bake step 320 is dependent on the type of photoresist material deposited on the surface of the substrate, but will generally be less than about 250° C. The time required to complete the post photoresist bake step 320 will depend on the temperature of the substrate during the post photoresist bake step, but will generally be less than about 60 seconds.

The post photoresist chill step 322, is a step used to control the time the substrate is at a temperature above ambient temperature so that every substrate sees the same time-temperature profile and thus process variability is minimized. Variations in the time-temperature profile can have an effect on properties of the deposited film layer and thus is often controlled to minimize process variability. The temperature of the post photoresist chill step 322, is thus used to cool the substrate after the post photoresist bake step 320 to a temperature at or near ambient temperature. The time required to complete the post photoresist chill step 322 will depend on the temperature of the substrate exiting the post photoresist bake step, but will generally be less than about 30 seconds.

The optical edge bead removal (OEBR) step 324, is a process used to expose the deposited light sensitive photoresist layer(s), such as, the layers formed during the photoresist coat step 318 and the BARC layer formed during the BARC coat step 312, to a radiation source (not shown) so that either or both layers can be removed from the edge of the substrate and the edge exclusion of the deposited layers can be more uniformly controlled. The wavelength and intensity of the radiation used to expose the surface of the substrate will depend on the type of BARC and photoresist layers deposited on the surface of the substrate. An OEBR tool can be purchased, for example, from USHIO America, Inc. Cypress, Calif.

The exposure step 326, is a lithographic projection step applied by a lithographic projection apparatus (e.g., stepper scanner 5) to form a pattern which is used to manufacture integrated circuits (ICs). The exposure step 326 forms a circuit pattern corresponding to an individual layer of the integrated circuit (IC) device on the substrate surface, by exposing the photosensitive materials, such as, the photoresist layer formed during the photoresist coat step 318 and the BARC layer formed during the BARC coat step 312 of some form of electromagnetic radiation.

The post exposure bake (PEB) step 328, is a step used to heat a substrate immediately after the exposure step 326 in order to stimulate diffusion of the photoactive compound(s) and reduce the effects of standing waves in the resist layer. For a chemically amplified resist, the PEB step also causes a catalyzed chemical reaction that changes the solubility of the resist. The control of the temperature during the PEB is typically critical to critical dimension (CD) control. The temperature of the PEB step 328 is dependent on the type of photoresist material deposited on the surface of the substrate, but will generally be less than about 250° C. The time required to complete the PEB step 328 will depend on the temperature of the substrate during the PEB step, but will generally be less than about 60 seconds.

The post exposure bake (PEB) chill step 330, is a step used to control the assure that the time the substrate is at a temperature above ambient temperature is controlled so that every substrate sees the same time-temperature profile and thus process variability is minimized. Variations in the PEB process time-temperature profile can have an effect on properties of the deposited film layer and thus is often controlled to minimize process variability. The temperature of the PEB chill step 330, is thus used to cool the substrate after the PEB step 328 to a temperature at or near ambient temperature. The time required to complete the PEB chill step 330 will depend on the temperature of the substrate exiting the PEB step, but will generally be less than about 30 seconds.

The develop step 332, is a process in which a solvent is used to cause a chemical or physical change to the exposed or unexposed photoresist and BARC layers to expose the pattern formed during the exposure process step 326. The develop process may be a spray or immersion or puddle type process that is used to dispense the developer solvent. In some develop processes, the substrate is coated with a fluid layer, typically deionized water, prior to application of the developer solution and spun during the development process. Subsequent application of the developer solution results in uniform coating of the developer on the substrate surface. In step 334, a rinse solution is provided to surface of the substrate, terminating the develop process. Merely by way of example, the rinse solution may be deionized water. In alternative embodiments, a rinse solution of deionized water combined with a surfactant is provided. One of ordinary skill in the art would recognize many variations, modifications, and alternatives.

In step 336, the substrate is cooled after the develop and rinse stets 332 and 334. In step 338, the substrate is transferred to the pod, thus completing the processing sequence. Transferring the substrate to the pod in step 338 generally entails the process of having the front end robot 108 return the substrate to a cassette 106 resting in one of the pod assemblies 105.

In the discussion of the previous processing sequence, transfer of the substrate from various chambers of the track lithography tool 10 to other chambers was generally omitted for purposes of clarity. One of skill in the art will appreciate the use of a number of transfer robots to accomplish the various transfers between appropriate chambers.

Figure 3B:
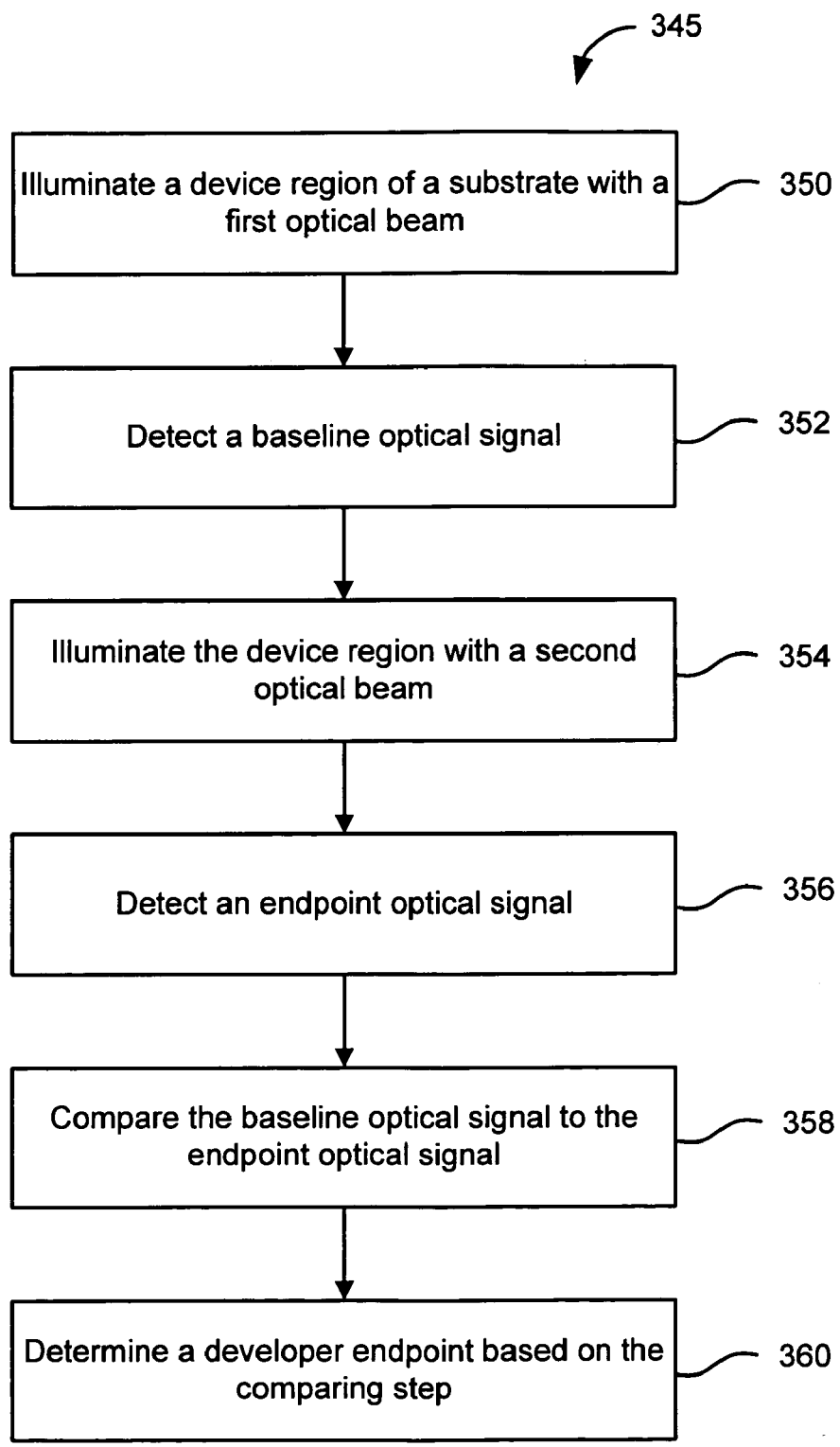
FIG. 3B is a flowchart illustrating a method of detecting developer endpoint according to one embodiment of the present invention.

FIG. 3B is a flowchart illustrating a method 345 of detecting developer endpoint according to one embodiment of the present invention. In step 350, a device region of a substrate is illuminated with a first optical beam. In some embodiments of the present invention, step 350 occurs prior to a current development stage of processing. Thus, for some product substrates, a pattern will be present on the device surface from previous processing steps. For substrates with previously developed patterns, step 350 occurs before development of a newly exposed pattern begins. In step 352, a baseline optical signal is detected by collecting radiation scattered from the surface of the substrate. As discussed previously, submicron patterns associated with the IC features and present on the device surface will reflect and diffract light. Additionally, refraction of light at the interfaces between fluids present on the surface and the device features will occur, generating a reflectometry and/or scatterometry profile.

In embodiments of the present invention, the baseline optical signal detected in step 352 is collected at any one of several stages of the processing sequence 300 illustrated in FIG. 3A. In some of these embodiments, the baseline optical signal is detected at stages of processing prior to the initiation of the development process in step 332 for the particular layer being developed. Moreover, in some embodiments, the baseline optical signal is detected in one of several process chambers. For example, methods and apparatus according to embodiments of the present invention may be provided in a coat chamber, a bake chamber, and the like. Merely by way of example, the baseline optical signal may be collected:

Pre-Resist—Prior to the coating of the substrate with photoresist in step 318. The underlying pattern resulting from previous processing steps will determine the baseline signal. In embodiments utilizing collection of the baseline optical signal prior to the PR coat step 318, the substrate may be transferred to a develop module in which a developer endpoint detection system according to an embodiment of the present invention is present. Alternatively, other embodiments of the present invention will provide either a portion of a developer endpoint detection system or a complete developer endpoint detection system in the coat module in which the PR coat process is performed. Accordingly, the baseline optical signal is collected prior to the PR coat process 318.

Post-Exposure—After exposure of the photoresist pattern in the scanner in step 326. Experiments have demonstrated that a latent image is present after exposure, thereby generating a baseline signal differing from the signal collected after the photoresist coating step. An explanation for the presence of the latent image is the presence of the underlying layers produced in previous processing steps. Another explanation for the latent image is the interaction between the exposure photons and the photoresist, resulting in compositional differences in the photoresist as a function of exposure dose. Although these theories provides support for describing the embodiments of the present invention, the present invention is not limited to these explanations are limited by them. Accordingly, in some embodiments, the baseline optical signal is collected after exposure in step 326 by transferring the substrate to a module including either a portion of a developer endpoint detection system or a complete developer endpoint detection system according to an embodiment of the present invention.

After Post-Exposure Bake—After the exposed substrate is baked in step 328 to activate chemical enhancement of the exposed photoresist layer. Experiments have demonstrated that a latent image is present after the post-exposure bake (PEB) step, thereby generating a baseline signal differing from the signal collected after the photoresist coating step. As discussed in relation to measurements made after the exposure step, the interaction of exposure photons with the optically activated photoresist is enhanced by the PEB step. Compositional differences in the exposed vs. unexposed photoresist are amplified by the bake step, resulting in additional contrast for the latent image.

After Substrate Coating—In some development processes, the substrate is coated with a fluid layer, typically deionized water, prior to application of the developer solution.

In embodiments in which the baseline signal is collected after substrate coating, the measurement is made in the developer module so that the substrate does not have to be moved between the baseline measurement and the endpoint measurement.

In step 354, the device region of the substrate is illuminated with a second optical beam. In some embodiments, the first optical beam and the second optical beam are produced by the same laser. In this case, the first and second optical beams will typically be collinear and will be sequentially projected onto the same detection area. In embodiments in which the baseline optical signal is measured after substrate coating, the substrate will generally be positioned in the same location during both the baseline measurement and the endpoint measurement. In embodiments in which the baseline measurement is made at prior stages of the exposure and development process, methods and systems are provided to orient the substrate prior to illumination, thereby enabling the system operator to produce repeatable results.

In step 356, an endpoint optical signal is detected from the device region of the substrate. As described in relation to FIG. 2, one or more detectors may be used in various embodiments of the present invention to detect one or more diffracted orders reflected, diffracted, and scattered off the substrate surface.

In some embodiments, the first and second optical beams will be multi-spectral beams containing a number of distinct wavelength components. In other embodiments, a tunable laser is used to generate a beam that produces a variety of different wavelengths as a function of time. In the case of a tunable laser, multiple baseline optical signal and multiple endpoint optical signals may be collected as a function of time using the various detectors illustrated in FIG. 2. One of ordinary skill in the art would recognize many variations, modifications, and alternatives resulting from the combination of a tunable source, diffraction effects as a function of wavelength and 2-D CCD arrays.

In step 358, the baseline optical signal and the endpoint optical signal are compared using algorithms adapted to this comparison task. Based on the comparison step, a developer endpoint is determined in step 360. In one embodiment, the intensity, for example, of the beam 220 at detector 240 is measured during the develop process and compared to the base line measurement made using detector 240. As the develop process progresses, changes in the endpoint signal will occur. In some embodiments, the endpoint signal will change during the development process and stabilize as the developer endpoint is reached. In some embodiments, the analysis of the detected signal includes examination of the spectral content received at the detectors, while in alternative embodiments, a single wavelength is used to determine the developer endpoint.

As developer endpoint is detected, a control system (not shown) provides feedback to the develop chamber, activating the release of a rinse solution onto the substrate surface. In a specific embodiment, a rinse solution of deionized water is provided to the substrate, terminating the develop process. In alternative embodiments, a rinse solution of deionized water combined with a surfactant is provided. One of ordinary skill in the art would recognize many variations, modifications, and alternatives.

Figure 4:
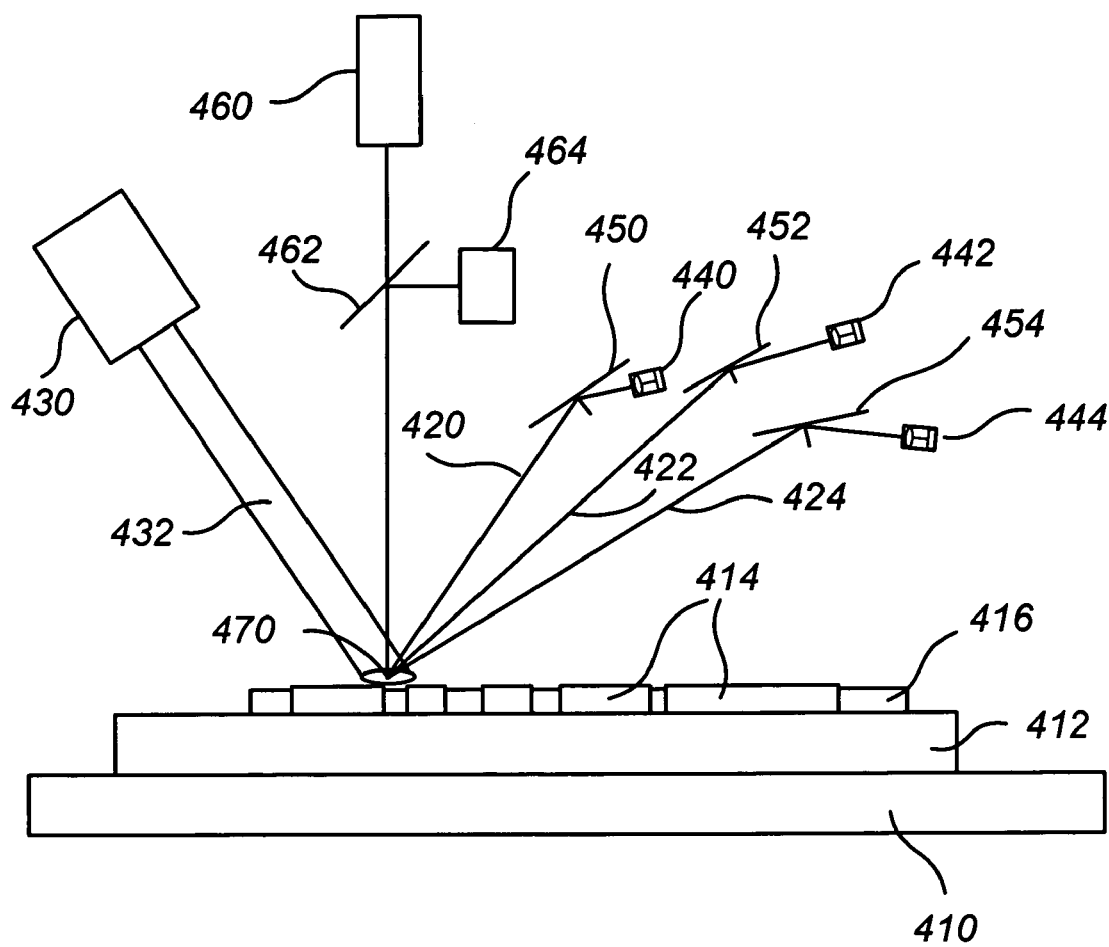
FIG. 4 is a simplified schematic diagram of a developer endpoint detection system according to an alternative embodiment of the present invention.

FIG. 4 is a simplified schematic diagram of a developer endpoint detection system according to an alternative embodiment of the present invention. FIG. 4 shares some similarities with FIG. 2 and for purposes of brevity, the description provided with reference to FIG. 2 will suffice to describe elements of FIG. 4. In FIG. 4, optical source 430, which may be a single frequency or tunable laser, produces optical beam 432, which is directed toward the surface of the substrate 412. The substrate is supported on chuck 410.

As illustrated in FIG. 4, a developer puddle 416 is illustrated on the surface of the substrate and intermingled with the device features 414. Although the developer puddle 416 illustrated in FIG. 4 is at a level below the upper surfaces of the device features, this is not required by the present invention. As will be evident to one of skill in the art, embodiments of the present invention may be used with developer puddles thicker than the device features being developed. Optical beam 432 impinges on the surface of the device features and the developer puddle and is reflected off the interfaces defining the boundaries of the device features and the developer puddle.

Additionally, the beam is refracted as it enters the developer puddle, subsequently reflecting off device features submerged under the developer puddle and refracting at the developer puddle/air interface. Moreover, the beam is diffracted by features on the order of the wavelength of the optical beam. For many sub-micron device features, significant diffraction of the beam results. In FIG. 4, these complex optical processes are represented by beams 420, 422, and 424. One of ordinary skill in the art would recognize that scattering of the beam as a result of diffuse reflection off the surface will generally result in a cone of scattered radiation, depending on the proportions of specular and diffuse reflection. Additionally, multiple reflections off layers and interfaces will generate interference patterns and other optical phenomena. For purposes of clarity in the illustration, these effects are incorporated into the simple beam 420, although it is appreciated that an optical system (not shown) is generally utilized to collect, collimate, and/or image the radiation reflected from the substrate surface onto the detectors 440, 442, and 444.

FIG. 4 also illustrates a second laser 460, beamsplitters 462, and detector 464. In some embodiments, the second laser 460 generates a beam that propagates along a line normal to the surface of the substrate 412, impinging on the detection area 470. As described below, the second laser, beamsplitters, and detector 464 are utilized to actively control for variation in the developer fluid surface. In some embodiments, external vibrations and other effects introduce perturbations in the surface of the developer fluid, locally modifying the surface of the developer from the desired planar surface parallel to the surface of the substrate. Using the system illustrated in FIG. 4, variations in the surface of the developer fluid will cause the beam reflected along path 466 to depart from a line collinear with the incident laser beam from laser 460. For example, if the developer surface tilts to the right, the reflected beam will veer to the right of the line normal to the developer surface, producing a detected spot above the line drawn between the beamsplitter 462 and the detector 464. Measurement of this beam deflection will be used to drive active mirrors, as described below.

Active mirrors 450, 452, and 454 are provided in the system illustrated in FIG. 4 and serve to correct for local modifications of the developer fluid surface. As variations in the developer surface are measured in the form of beam deflections at detector 464, a control system (not shown) provides inputs to actuate active mirrors 450, 452, and 454, thereby counteracting tilting of beams 420, 422, and 424 as a result of the location modifications of the developer surface.

In a specific embodiment, the detector 464 is a two-dimensional CCD array that monitors beam deflections in 5 directions lying in the plane of the substrate. The active mirrors can be small and compact, such as those used on the micromirror chip available from Texas Instruments, Inc., of Dallas, Tex. For purposes of clarity, the active mirrors are shown an widely separated in FIG. 4, but one of skill in the art will appreciate that an array of mirrors, coupled to an array of detectors may be used according to embodiments of the present invention.

In alternative embodiments, a Fresnel lens (not shown) is utilized in the optical path between the substrate surface and the detectors 440, 442, and 444. In some embodiments, the Fresnel lens is selected because generally, Frensel lenses are fast (low ratio of focal length to diameter) and thin in comparison to spherical lenses of the same diameter. The use of a lens in this optical path may provide for focusing of light onto the detectors, increasing the optical throughput of the system and enhancing system performance.

The examples and embodiments described herein are for illustrative purposes only. Various modifications or changes in light thereof will be suggested to persons skilled in the art and are to be included within the spirit and purview of this application and scope of the appended claims. It is not intended that the invention be limited, except as indicated by the appended claims.

What is claimed is:

1. A method of detecting developer endpoint, the method comprising:
    illuminating a device region of a substrate with a first optical beam prior to initiating a development stage of processing;
    detecting a baseline optical signal reflected from the device region of the substrate prior to initiating a development stage of processing;
    illuminating the device region of the substrate with a second optical beam during a development stage of processing;
    detecting an endpoint optical signal reflected from the device region of the substrate during a development stage of processing;
    comparing the baseline optical signal to the endpoint optical signal; and
    determining a developer endpoint based on the comparing step.

2. The method of claim 1 wherein the step of illuminating the device region of the substrate with the first optical beam is performed while the substrate is coated with water prior to application of develop chemistry.

3. The method of claim 1 wherein the device region is a region comprising active elements.

4. The method of claim 1 wherein the baseline optical signal and the endpoint optical signal comprise reflected and diffracted portions.

5. The method of claim 1 wherein the first optical beam and the second optical beam are collinear and produced by the same laser source.

6. The method of claim 2 wherein the first optical beam is a laser beam having a first wavelength and the second optical beam is a laser beam having a second wavelength.

7. The method of claim 1 wherein detecting a baseline optical signal is performed prior to coating of the substrate with a photoresist layer.

8. The method of claim 1 wherein detecting a baseline optical signal is performed prior to exposing a photoresist layer.

9. The method of claim 1 wherein detecting a baseline optical signal is performed after baking of a photoresist layer.

10. The method of claim 9 wherein detecting a baseline optical signal is performed after coating of the substrate with a layer of deionized water prior to application of a developer solution.

* * * * *